United States Patent
Um et al.

(10) Patent No.: US 9,184,280 B2
(45) Date of Patent: Nov. 10, 2015

(54) SEMICONDUCTOR DEVICE HAVING DUAL PARALLEL CHANNEL STRUCTURE AND METHOD OF FABRICATING THE SAME

(71) Applicant: Samsung Electronics Co., Ltd., Suwon-Si, Gyeonggi-Do (KR)

(72) Inventors: Chang-yong Um, Seoul (KR); Jai-kwang Shin, Anyang-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 13/960,333

(22) Filed: Aug. 6, 2013

(65) Prior Publication Data

US 2014/0197479 A1    Jul. 17, 2014

(30) Foreign Application Priority Data

Jan. 14, 2013 (KR) ........................ 10-2013-0004038

(51) Int. Cl.
- *H01L 29/78* (2006.01)
- *H01L 29/66* (2006.01)
- *H01L 29/423* (2006.01)
- *H01L 29/08* (2006.01)
- *H01L 29/10* (2006.01)
- *H01L 21/28* (2006.01)

(52) U.S. Cl.
CPC ........ *H01L 29/7813* (2013.01); *H01L 29/0865* (2013.01); *H01L 29/1095* (2013.01); *H01L 29/42376* (2013.01); *H01L 29/66734* (2013.01); *H01L 21/2815* (2013.01)

(58) Field of Classification Search
CPC ............ H01L 29/1095; H01L 29/0865; H01L 29/42376; H01L 29/66734; H01L 29/7813; H01L 29/4236; H01L 29/66727; H01L 21/2815

See application file for complete search history.

(56) References Cited

U.S. PATENT DOCUMENTS

| | | | |
|---|---|---|---|
| 5,744,826 A | 4/1998 | Takeuchi et al. | |
| 5,831,288 A | 11/1998 | Singh et al. | |
| 6,180,958 B1 | 1/2001 | Cooper, Jr. | |
| 6,570,185 B1 | 5/2003 | Tan | |
| 6,800,509 B1 * | 10/2004 | Lin et al. | 438/138 |
| 6,956,238 B2 | 10/2005 | Ryu et al. | |
| 7,791,135 B2 * | 9/2010 | Ueno | 257/330 |
| 2008/0217684 A1 | 9/2008 | Hashimoto et al. | |
| 2010/0001314 A1 | 1/2010 | Yanagigawa | |

FOREIGN PATENT DOCUMENTS

JP  2009-081323 A  4/2009
KR  2009-0057245 A  6/2009

\* cited by examiner

*Primary Examiner* — Whitney T Moore
(74) *Attorney, Agent, or Firm* — Harness, Dickey & Pierce, P.L.C.

(57) ABSTRACT

A semiconductor device may include a substrate having a drift region doped to a first conduction type. A trench may be etched into an upper surface of the substrate. A gate may be arranged along side walls of the trench. A gate oxide layer may be between the side walls of the trench and gate and between a bottom surface of the trench and gate. A first source region of the first conduction type may be on the upper surface of the substrate. A second source region of the first conduction type may be on the bottom surface of the trench. A first well region may be between the first source region and drift region, and a second well region may be between the second source region and drift region, the first and second well regions being doped to a second conduction type (electrically opposite to the first conduction type).

14 Claims, 10 Drawing Sheets

SEMICONDUCTOR DEVICE HAVING DUAL PARALLEL CHANNEL STRUCTURE AND METHOD OF FABRICATING THE SAME

CROSS-REFERENCE TO RELATED APPLICATION

This application claims priority under 35 U.S.C. §119 to Korean Patent Application No. 10-2013-0004038, filed on Jan. 14, 2013 in the Korean Intellectual Property Office, the disclosure of which is incorporated herein in its entirety by reference.

BACKGROUND

1. Field

The present disclosure relates to a semiconductor device having a dual parallel channel structure and a method of fabricating the same. More particularly, the present disclosure relates to a high power semiconductor device having a dual parallel channel structure capable of reducing an On-resistance and preventing a relatively large electric field from being applied to a gate oxide layer under a gate and a method of fabricating the same.

2. Description of the Related Art

In a power converting system for receiving a main power to be converted into a voltage required for a plurality of devices or to be distributed, the function of a power switching device is important. For example, the power switching device may be realized by a transistor based on a semiconductor material such as silicon, GaN, or SiC, like a metal oxide semiconductor field effect transistor (MOSFET). The power switching device is required to have a relatively high breakdown voltage. A large amount of research on the power switching device is being conducted in order to obtain characteristics of reduction in an On-resistance, high density integration, and rapid switching.

For example, a field effect transistor (FET) of a trench gate structure, in which a trench is vertically formed and a gate oxide layer and a gate are formed in the trench, is advantageous in terms of high current and high density integration. However, in the FET of the trench gate structure, since the gate oxide layer under the gate is exposed to a drain formed under a substrate, when a high voltage is applied to the drain in an Off state, a large electric field is concentrated on the gate oxide layer under the gate. Therefore, insulation breakdown may be generated by the gate oxide layer before reaching the breakdown voltage.

On the other hand, it is relatively difficult to put the MOSFET using SiC into commercial use due to the relatively low channel mobility. Therefore, for example, research on improving mobility through a nitridation process is being conducted. However, since a threshold voltage is lowered as the mobility is increased, there are limitations to improving the mobility.

SUMMARY

The present disclosure relates to a high power semiconductor device having a dual parallel channel structure capable of minimizing reduction in a threshold voltage, reducing an On-resistance, and reducing or preventing a relatively large electric field from being applied to a gate oxide layer thereunder.

The present disclosure also relates to a method of fabricating the high power semiconductor device.

According to an example embodiment, a semiconductor device may include a substrate having a drift region doped to a first conduction type, a trench formed by vertically etching an upper surface of the substrate, a gate arranged along side walls of the trench, a gate oxide layer arranged between the side walls of the trench and the gate and between a bottom surface of the trench and the gate, a first source region of the first conduction type formed on the upper surface of the substrate, a second source region of the first conduction type formed on the bottom surface of the trench, a first well region formed between the first source region and the drift region, and a second well region formed between the second source region and the drift region, wherein the first and second well regions are doped to a second conduction type which is electrically opposite to the first conduction type.

The semiconductor device may further include a drain electrode arranged on a lower surface of the substrate, a source electrode formed on the substrate and in the trench so as to be electrically connected to the first and second source regions, and an interlayer insulating layer that covers the gate and the gate oxide layer so that the gate and the gate oxide layer do not contact the source electrode.

The semiconductor device may further include a first ohmic contact layer arranged between the first well region and the source electrode so as to provide an ohmic contact between the source electrode and the first source region and a second ohmic contact layer arranged in a central portion of the second source region so as to be adjacent to the second source region in order to provide ohmic contact between the source electrode and the second source region.

The first ohmic contact layer may be arranged on the first well region so as to be adjacent to the first source region. The second ohmic contact layer may be arranged on the second well region so as to be adjacent to the second source region.

The first and second ohmic contact layers may be second conduction type doped.

The substrate may include a lower region and the drift region formed on the lower region. The lower region and the drift region may be doped to the first conduction type and a doping concentration of the drift region may be lower than that of the lower region.

The lower region of the substrate may be N+-doped, and the drift region may be N-doped.

The gate may be formed along the side walls of the trench so as to be circular/elliptical-shaped, polygonal ring-shaped, or linear-shaped.

The gate oxide layer may be formed at an edge of the bottom surface of the trench and along the side walls of the trench so that the central portion of the bottom surface of the trench may be partially exposed.

The second source region may be partially formed in the central portion of the bottom surface of the trench so as to occupy less than the entire bottom surface of the trench. The gate may overlap the second source region. As a result, an edge of the second source region may face the gate.

The first source region may be arranged to face an upper portion of a side surface of the gate. The second source region may be arranged under the gate to so as to face the bottom surface of the gate.

For example, the first and second source regions may be N+-doped.

The first well region may be formed below the entire first source region. The second well region may entirely surround the bottom surface and the side walls of the second source region.

A part of the second well region that surrounds the side walls of the second source region may face the bottom surface of the gate.

For example, the first and second well regions may be P-doped.

According to an example embodiment, a method of fabricating a semiconductor device may include vertically etching an upper surface of a substrate (which may include a lower region and a drift region on the lower region) to form a trench, the lower region and the drift region of the substrate being doped to a first conduction type, doping the upper surface of the substrate and a bottom surface of the trench to a second conduction type to form a first well region and a second well region, forming a first source region and a second source region on the first well region and the second well region, respectively, the first and second source region being doped to the first conduction type, forming a gate insulating layer at an edge of the bottom surface of the trench and side walls of the trench, and forming a gate on the gate insulating layer at the edge of the bottom surface of the trench and along the side walls of the trench.

For example, the lower region of the substrate may be N+-doped and the drift region may be N-doped.

Forming the trench may be performed when an alignment key is formed on a surface of the substrate.

The method may further include controlling an etching depth so that the bottom surface of the trench is in the drift region.

Forming the first well region and the second well region may include forming a mask that surrounds the side walls of the trench so that only the central portion of the bottom surface of the trench is exposed and the edge of the bottom surface is covered and doping the upper surface of the substrate to the second conduction type to form the first well region and doping the exposed bottom surface of the trench to the second conduction type to form the second well region.

Forming the mask may include depositing a mask material on the upper surface of the substrate and the side walls and the bottom surface of the trench and partially leaving the mask material on the side walls of the trench and removing the remaining mask material using anisotropic etching.

For example, forming the first source region and the second source region may include increasing a thickness of the mask to cover the edge of the second well region with the mask and doping the first well region on the upper surface of the substrate to the first conduction type to form the first source region and doping the exposed portion of the second well region to the first conduction type to form the second source region so that the second well region entirely surrounds the lower surface and the side surfaces of the second source region.

For example, the first and second source regions may be N+-doped and the first and second well regions may be P-doped.

The method may further include doping the edge of the first source region and the central portion of the second source region to the second conduction type to form a first ohmic contact layer and a second ohmic contact layer.

Forming the gate oxide layer and the gate may include forming a gate oxide layer on the upper surface of the substrate and on the side walls and the bottom surface of the trench to a uniform thickness, depositing a gate material along the gate oxide layer, and partially leaving the gate material on the side walls of the trench and removing the remaining gate material to form a gate using anisotropic etching.

The method may further include forming an interlayer insulating layer on the upper surface of the substrate and on the side walls and the bottom surface of the trench to cover the gate and the gate oxide layer, partially removing the gate oxide layer and the interlayer insulating layer that cover the first and second source regions to expose parts of the first and second source regions, and depositing a conductive material on the upper surface of the substrate and in the trench to form a source electrode.

BRIEF DESCRIPTION OF THE DRAWINGS

The above and other features and advantages of the present disclosure will become more apparent upon review of the example embodiments with reference to the attached drawings in which.

DETAILED DESCRIPTION

Figure 1:
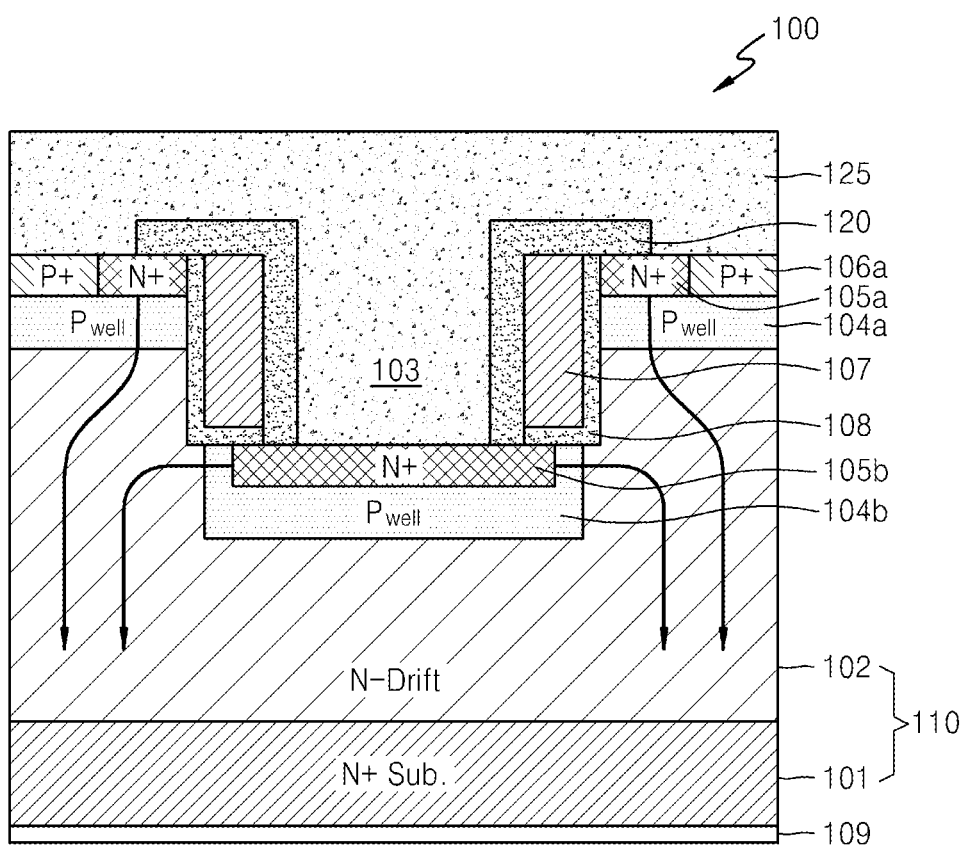
FIG. 1 is a cross-sectional view schematically illustrating a structure of a semiconductor device according to an example embodiment.

Hereinafter, a semiconductor device having a dual parallel channel structure and a method of fabricating the semiconductor device will be described in more detail with reference to the accompanying drawings. In the drawings, the same reference numerals represent the same element and the sizes of various elements may have been exaggerated for improved clarity and for the sake of convenience. Embodiments described hereinafter are only examples and various changes may be made therein.

It will be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms, "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art. It will be further understood that terms, including those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view schematically illustrating a structure of a semiconductor device according to an example embodiment.

Referring to FIG. 1, a semiconductor device 100 according to an example embodiment may include a substrate 110 having a drift region 102 doped to a first conduction type, a trench 103 formed by vertically etching an upper surface of the substrate 110, a gate 107 arranged along internal side walls of the trench 103, a gate oxide layer 108 arranged between the side walls of the trench 103 and the gate 107 and between a bottom surface of the trench 103 and the gate 107, a first source region 105a formed on the upper surface of the substrate 110, a second source region 105b formed on the bottom surface of the trench 103, a first well region 104a formed between the first source region 105a and the drift region 102, and a second well region 104b formed between the second source region 105b and the drift region 102. In addition, the semiconductor device 100 may further include a drain electrode 109 arranged on a lower surface of the substrate 110, a source electrode 125 formed on the substrate 110 and in the trench 103 so as to be electrically connected to the first and second source regions 105a and 105b, and an interlayer insulating layer 120 that covers the gate 107 and the gate oxide layer 108 so that the gate 107 and the gate oxide layer 108 do not contact the source electrode 125.

The semiconductor device 100 may be a high power transistor that may be used as a power switching device, in particular, a high power metal oxide semiconductor field effect transistor (MOSFET) of a trench gate structure. Therefore, the substrate 110 may have the drift region 102 doped at a relatively low concentration so that the semiconductor device 100 has a voltage withstanding characteristic. For example, a lower part 101 of the substrate 110 is N+-doped to function as a drain region and an upper part of the substrate 110 may be the drift region 102 N-doped at a lower concentration than an N+-doping concentration for the voltage withstanding characteristic. For example, the substrate 110 including the drift region 102 may be formed of a semiconductor material, for example, silicon and silicon carbide (SiC).

Figure 2:
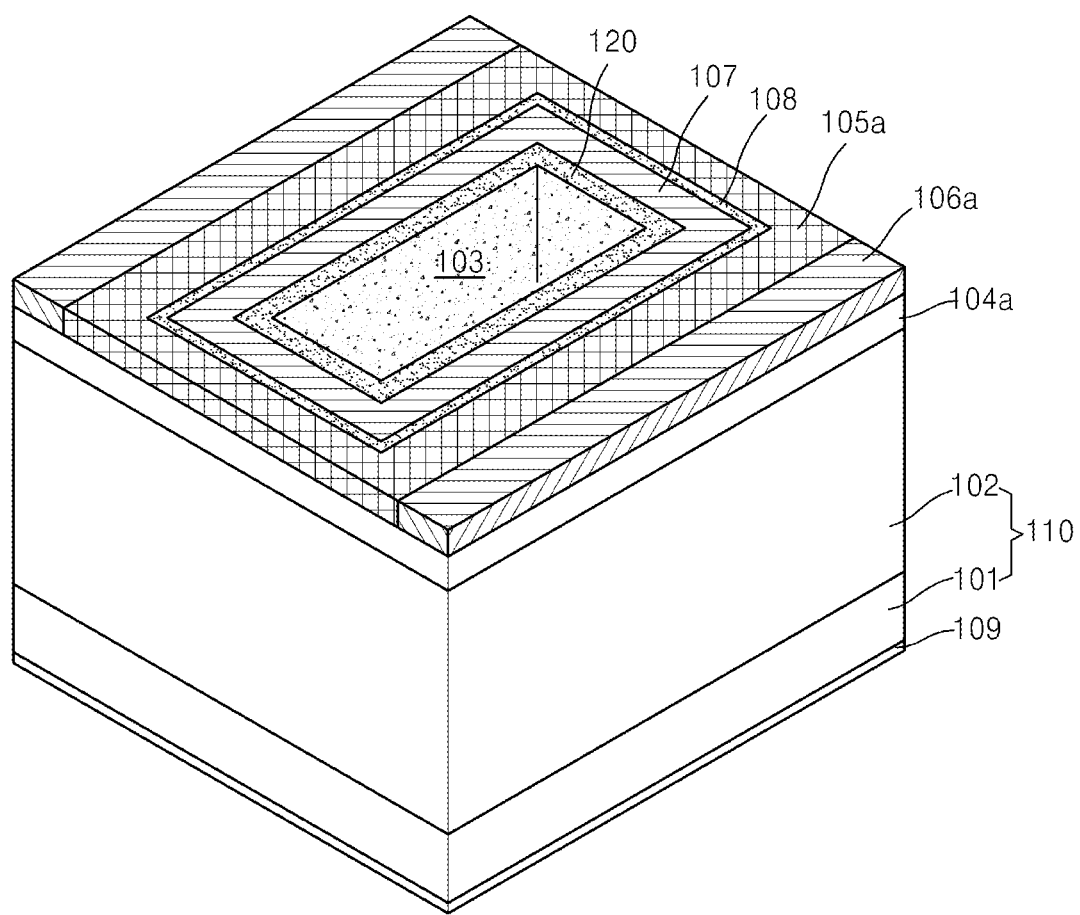
FIG. 2 is a schematic perspective view illustrating a structure of a gate of the semiconductor device illustrated in FIG. 1.

The trench 103 may be formed by vertically etching the upper surface of the substrate 110, in particular, a part of the drift region 102. In FIG. 1, the drawing appears to show that the two gates 107 are separate structures formed on both side walls of the trench 103. However, the gates 107 illustrated on both side walls of the trench 103 are actually connected to each other to form one gate. For example, as illustrated in FIG. 2, one ring-shaped gate 107 may be formed along the side walls of the trench 103. In FIG. 2, the trench 103 and the gate 107 are square-shaped. However, the above is only an example, and it should be understood that the present embodiment is not limited thereto. Shapes of the trench 103 and the gate 107 may be appropriately selected in consideration of a crystal structure of a material of the substrate 110 and the efficiency of fabricating processes. For example, shapes of the gate 107 may be circular/elliptical or in the form of polygonal rings (such as hexagonal rings) or straight lines.

The gate oxide layer 108 is interposed between the gate 107 and the trench 103 so that the gate 107 does not directly contact the bottom surface or the side walls of the trench 103. The gate oxide layer 108 may be formed of a silicon oxide, a silicon nitride, or another dielectric material having a relatively high dielectric constant (High-K). As illustrated in FIGS. 1 and 2, the gate oxide layer 108 may be arranged between the side walls of the trench 103 and the gate 107 and between the bottom of the trench 103 and the gate 107. Since the gate oxide layer 108 is formed at an edge of the bottom surface of the trench 103 and along the side walls of the trench 103, a central portion of the bottom surface of the trench 103 may be partially exposed.

In addition, the remaining surface of the gate 107 that does not contact the gate oxide layer 108 may be covered with the interlayer insulating layer 120. The interlayer insulating layer 120 may completely cover the gate 107 and the gate oxide layer 108 so that the gate 107 and the gate oxide layer 108 do not contact the source electrode 125 and may be extended to an upper surface of the first source region 105a. In a non-limiting embodiment, the first source region 105a may not be overlapped by the interlayer insulating layer 120. In addition, the interlayer insulating layer 120 may be extended to the edge of the bottom surface of the trench 103. Therefore, since the center of the bottom surface of the trench 103 may be exposed to the outside, the source electrode 125 filled in the trench 103 may be electrically connected to the second source region 105b formed on the bottom surface of the trench 103. The interlayer insulating layer 120 may be formed of the same material as that of the gate oxide layer 108. In addition, the source electrode 125 may be extended from the trench 103 to the upper surface of the substrate 110 to be electrically connected to the first source region 105a.

The first source region 105a and the second source region 105b may be formed on the upper surface of the substrate 110 and on the bottom surface of the trench 103, respectively. Referring to FIG. 1, the first source region 105a may be formed on the upper surface of the substrate 110 that is not etched, that is, in upper regions of the side walls of the trench 103. On the other hand, the second source region 105b may not be formed on the entire bottom surface of the trench 103, but rather, only partially formed in the center of the bottom surface of the trench 103. For example, the second source region 105b may be formed to have a size in which an edge of the second source region 105b faces the gate 107. Therefore, the first source region 105a may be arranged to face side surfaces of the gate 107 in an upper part of the gate 107 and the second source region 105b may be arranged to face a bottom surface of the gate 107 under the gate 107. The first and second source regions 105a and 105b may be first conduction type doped like the substrate 110. For example, the first and second source regions 105a and 105b may be N+-doped.

In addition, the first well region 104a and the second well region 104b may be formed between the first source region 105a and the drift region 102 and between the second source region 105b and the drift region 102, respectively. The first well region 104a and the second well region 104b may reduce the intensity of an electric field so that an excessively large electric field is not applied to the gate oxide layer 108. The first well region 104a may be formed below the entire region of the first source region 105a so that the first source region 105a does not directly contact the drift region 102. In addition, as illustrated in FIG. 1, the second well region 104b may be formed to surround a lower surface and side surfaces of the second source region 105b so that the second source region 105b does not directly contact the drift region 102. For example, the second well region 104b may be formed to have a size in which an edge of the second well region 104b faces outer walls of the gate 107. For example, a part of the second well region 104b that surrounds side walls of the second source region 105b may face the bottom surface of the gate 107. The first and second well regions 104a and 104b may be doped to a second conduction type, the second conduction type being electrically opposite to the first conduction type. For example, the first and second well regions 104a and 104b may be P-doped.

Figure 3:
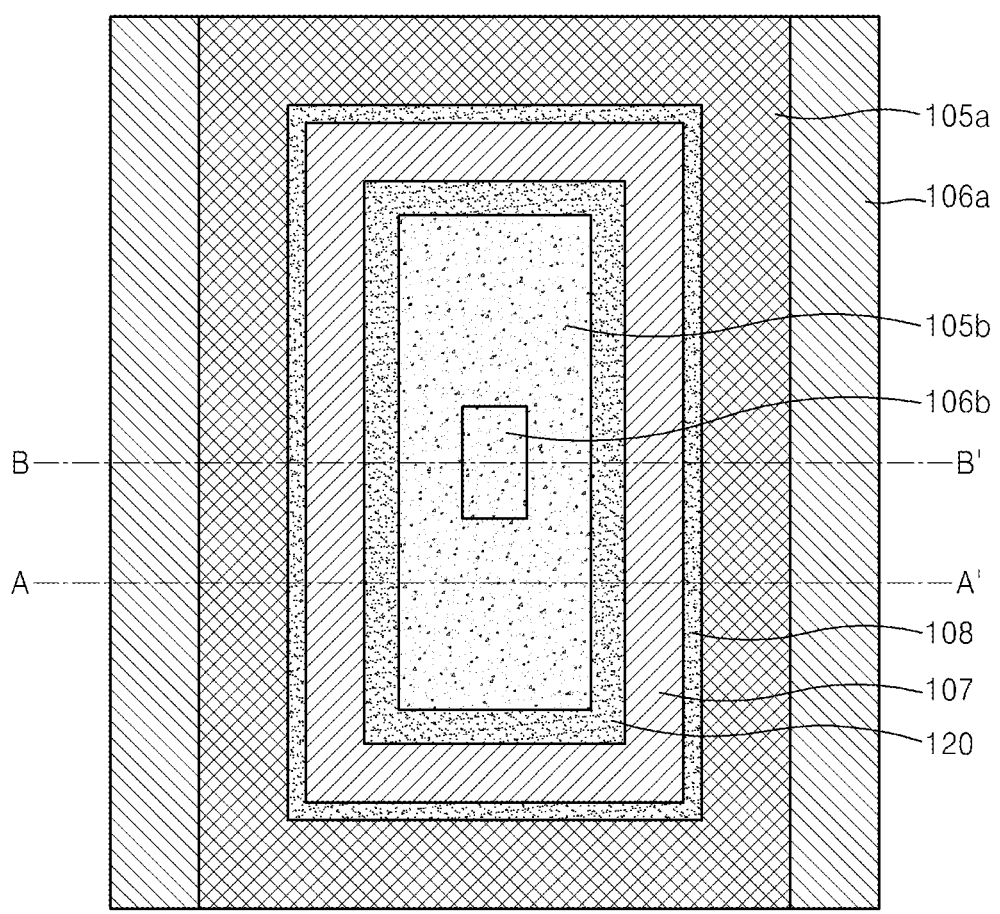
FIG. 3 is a plan view illustrating an inside of a trench of the semiconductor device illustrated in FIG. 1.

In order to provide an ohmic contact layer between the source electrode 125 and the first source region 105a, a first ohmic contact layer 106a may be further arranged between the first well region 104a and the source electrode 125. For example, the first ohmic contact layer 106a may be arranged on the first well region 104a so as to be adjacent to the first source region 105a and may electrically contact the first source region 105a and the source electrode 125. FIG. 3 is a plan view illustrating the first ohmic contact layer 106a. In FIG. 3, for the sake of convenience, the source electrode 125 has been removed. As illustrated in FIG. 3, the first ohmic contact layer 106a may be, for example, linearly formed along external side surfaces of the first source region 105a. Therefore, the first source region 105a may be positioned between the gate 107 and the first ohmic contact layer 106a.

In addition, as illustrated in FIG. 3, in order to provide ohmic contact between the source electrode 125 and the second source region 105b, a second ohmic contact layer 106b may be provided in the trench 103. The second ohmic contact layer 106b may be formed in a central portion of the second source region 105b so as to be adjacent to the second source region 105b. For example, referring to FIG. 4 (which is a cross-sectional view taken along a line B-B' of FIG. 3), the second ohmic contact layer 106b may be arranged on the second well region 104b together with the second source region 105b and may electrically contact the second source region 105b and the source electrode 125. The first and second ohmic contact layers 106a and 106b may be doped to the second conduction type at a relatively high doping concentration. For example, the first and second ohmic contact layers 106a and 106b may be P+-doped. On the other hand, FIG. 1 may be a cross-sectional view taken along a line A-A' of FIG. 3.

In the semiconductor device 100 having the above-described structure, when a voltage is applied to the gate 107, a first current flows between the first source region 105a and the drain electrode 109, and a second current flows between the second source region 105b and the drain electrode 109. That is, as indicated by the arrows of FIG. 1, when the semiconductor device 100 is turned on, two channels may be formed. Therefore, it may be considered that the semiconductor device 100 according to the present disclosure has a dual parallel channel structure. Therefore, since a current may flow through two channels, an On resistance $R_{on}$ of the semiconductor device 100 may be reduced. In addition, since the intensity of the electric field applied to the gate oxide layer 108 may be reduced by the first and second well regions 104a and 104b, a breakdown voltage of the semiconductor device 100 may be increased. In particular, since the second well region 104b and the second source region 105b are arranged under the trench 103, it is possible to prevent a relatively large electric field from being concentrated on the gate oxide layer 108 around the bottom surface of the trench 103.

Figure 4:
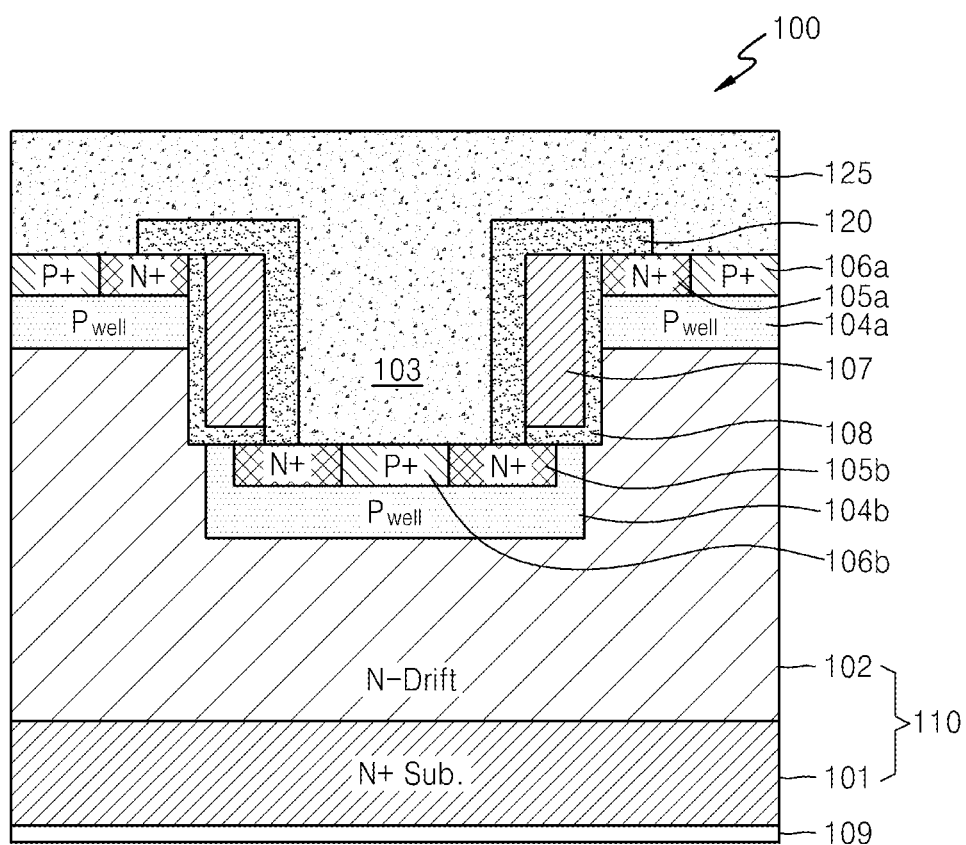
FIG. 4 is a cross-sectional view schematically illustrating a structure of the semiconductor device of FIG. 3, taken along line B-B'.

FIGS. 5A to 5I are cross-sectional views schematically illustrating processes of fabricating the semiconductor device 100 illustrated in FIG. 4. Hereinafter, a method of fabricating the semiconductor device 100 according to an example embodiment will be described with reference to FIGS. 5A to 5I.

Figure 5A:
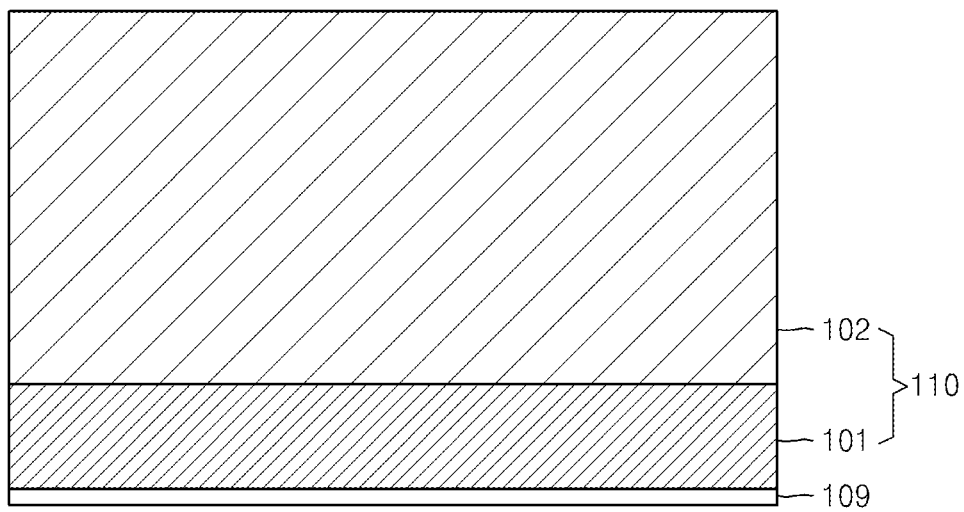
FIGS. 5A to 5I are cross-sectional views schematically illustrating processes of fabricating the semiconductor device illustrated in FIG. 4.

First, as illustrated in FIG. 5A, the substrate 110 including the N+-doped lower part 101 and the N-doped drift region 102 is provided. In FIG. 5A, it is illustrated that the drain electrode 109 is already formed under the substrate 110. However, the present embodiment is not limited to the above. For example, the drain electrode 109 may be formed after the processes illustrated in FIG. 5I are completed.

Figure 5B:
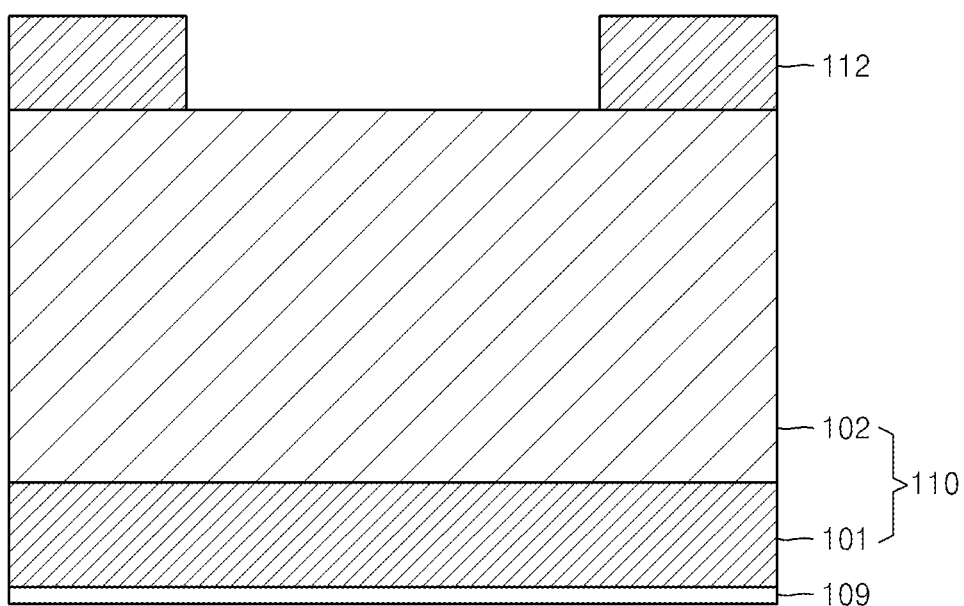
Figure 5C:
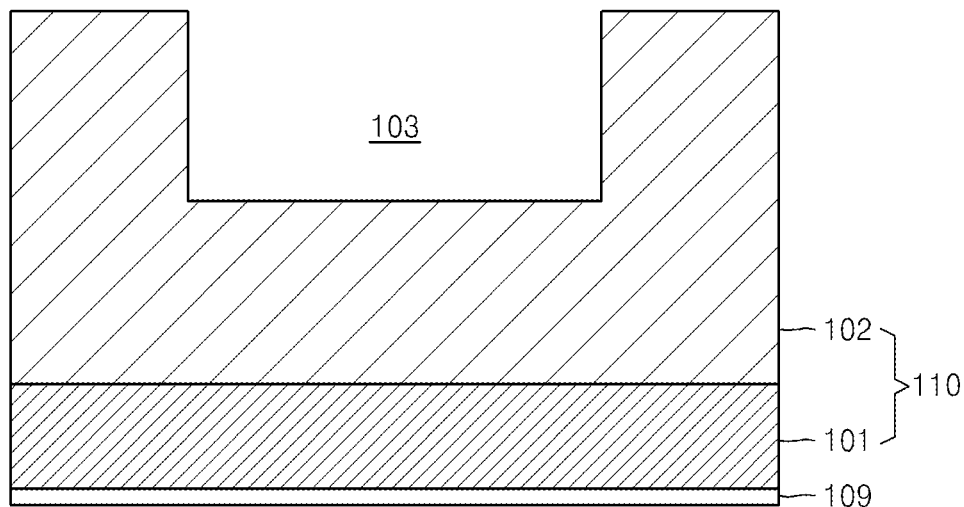

When the substrate 110 is provided, as illustrated in FIG. 5B, a mask 112 is formed and patterned on an upper surface of the substrate 110. The mask 112 may be patterned so that a part of the mask 112 corresponding to a position in which a trench is to be formed is removed and a central portion of the upper surface of the substrate 110 is exposed. Then, as illustrated in FIG. 5C, the exposed portion of the substrate 110 is vertically etched so that the trench 103 may be formed. An etching depth may be controlled so that the bottom surface of the trench 103 is in the drift region 102 of the substrate 110 (as opposed to extending into the lower part 101. The processes of forming the trench illustrated in FIGS. 5B and 5C may be performed when an alignment key (not shown) is formed on the substrate 110. In general, since a plurality of semiconductor devices 100 are fabricated on one substrate 110, the alignment key is formed at an edge of the upper surface of the substrate 110 so that a series of fabricating processes including processes of depositing and etching a material may be performed in correct positions. Since the trench 103 may be formed in a step of forming the alignment key, an additional process may not be required in order to form the trench 103.

Figure 5D:
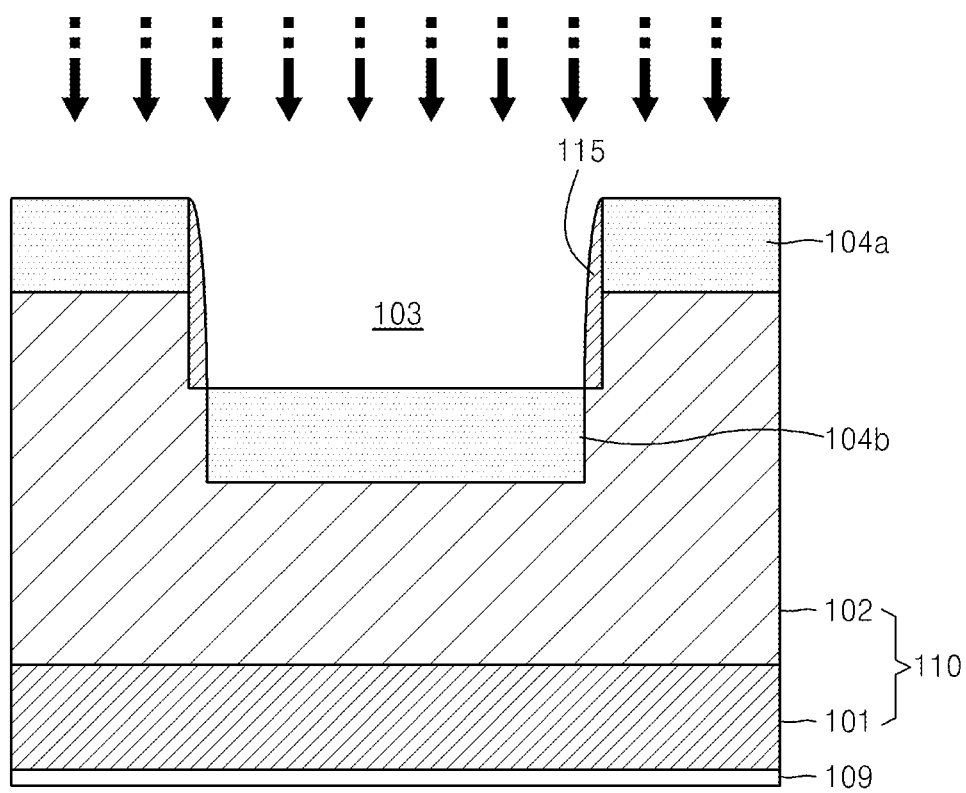

Next, referring to FIG. 5D, the internal side walls of the trench 103 are covered by a mask 115. As a result, only the central portion of the bottom surface of the trench 103 is exposed, and the edge of the bottom surface is covered with the mask 115. A process of forming the mask 115 may include, for example, a step of depositing a mask material on the upper surface of the substrate 110 and the side walls and the bottom surface of the trench 103 to a uniform thickness and a step of removing the deposited mask material by anisotropic etching. Then, while the mask material is completely removed from the upper surface of the substrate 110 and the central portion of the bottom surface of the trench 103, the mask material is partially left on the internal side walls of the trench 103 so that the mask 115 may be formed. When the mask 115 is formed by the above method, since photolithography and etching processes for patterning the mask 115 may be omitted, fabricating cost and time with respect to the semiconductor device 100 may be reduced.

After forming the mask 115 on the internal side walls of the trench 103, as illustrated in FIG. 5D, p-type impurities are implanted into the upper surface of the substrate 110 and the exposed bottom surface of the trench 103 by using, for example, ion implantation. Then, the P-doped first and second well regions 104a and 104b may be formed in the upper surface of the substrate 110 and the bottom surface of the trench 103.

Figure 5E:
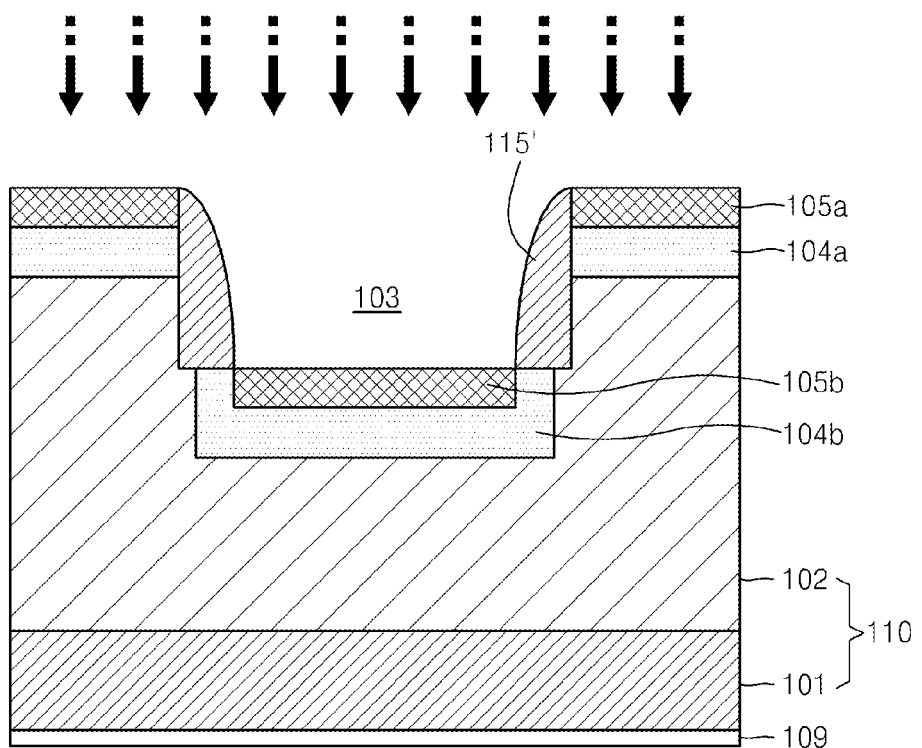

Then, as illustrated in FIG. 5E, the thickness of the mask 115 is increased so that a mask 115' is further formed on the internal side walls of the trench 103. For example, in a state where the mask 115 illustrated in FIG. 5D is not removed, processes of depositing a mask material and anisotropic etching the deposited mask material may be further performed. As a result, the mask 115' (which is thicker than the mask 115 illustrated in FIG. 5D) may be formed. Thus, the mask 115' covers the edge of the second well region 104b.

Then, n-type impurities are implanted into the first well region 104a formed in the upper surface of the substrate 110 and the exposed portion of the second well region 104b in the trench 103 by using, for example, the ion implantation. As a result, the N+-doped first and second source regions 105a and 105b may be formed on the first well region 104a and the second well region 104b, respectively. At this time, implantation energy is appropriately controlled so that depths of the first and second source regions 105a and 105b are not larger than depths of the first and second well regions 104a and 104b. On the other hand, since the mask 115' is formed on the edge of the second well region 104b so as to overlap the second well region 104b, the second source region 105b may be formed so as to be only in the central portion of the second well region 104b.

Figure 5F:
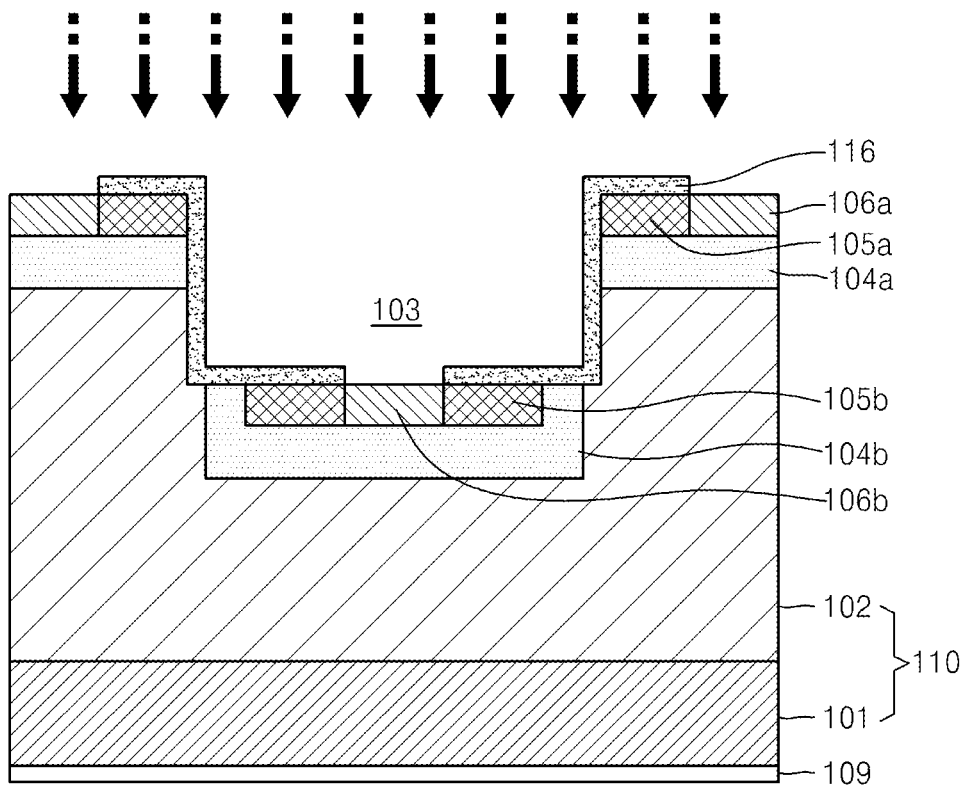

Next, as illustrated in FIG. 5F, the mask 115' on the internal side walls of the trench 103 is completely removed. Then, after forming a mask 116 on the upper surface of the substrate 110 and in the trench 103 to a uniform thickness, the mask 116 is patterned so that a part of the first source region 105a and a part of the second source region 105b are exposed. For example, the mask 116 may be patterned so that the outside edge of the first source region 105a is exposed and the central portion of the second source region 105b is exposed. After patterning the mask 116, p-type impurities may be implanted into the exposed first and second source regions 105a and 105b by using the ion implantation. Then, the P+-doped first and second ohmic contact layers 106a and 106b may be formed on the first well region 104a and the second well region 104b, respectively.

Figure 5G:
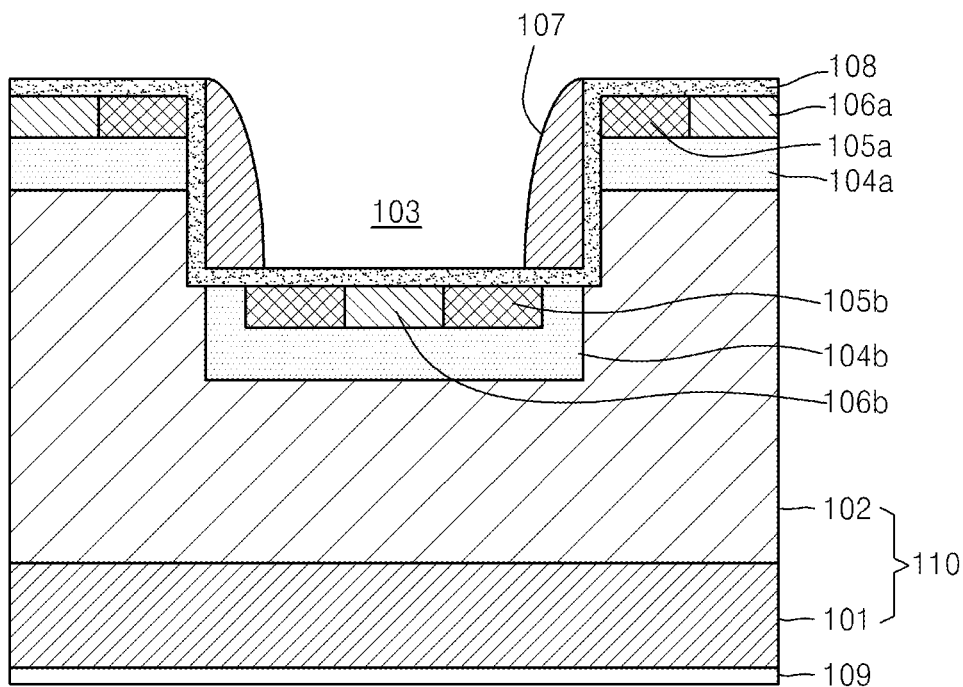

Then, as illustrated in FIG. 5G, the mask 116 is removed and gate oxide layer 108 may be formed on the upper surface of the substrate 110 and the side walls and the bottom surface of the trench 103 to a uniform thickness. After forming the gate oxide layer 108, the gate 107 may be formed along the internal side walls of the trench 103. The method of forming the gate 107 may be the same as the above-described method of forming the mask 115. For example, after depositing a gate material along the gate oxide layer 108 to a uniform thickness, the gate material on the upper surface of the substrate 110 and in the central portion of the bottom surface of the trench 103 may be removed through anisotropic etching. As a result, the gate material is partially left only on the internal side walls of the trench 103 so that the gate 107 may be formed. When the gate 107 is formed by the above method, photolithography and etching processes for patterning the gate 107 may be omitted. Therefore, the fabricating cost and time with respect to the semiconductor device 100 may be reduced. Furthermore, as noted herein, the gate 107 may have various shapes and forms and is not limited to the structure shown.

Figure 5H:
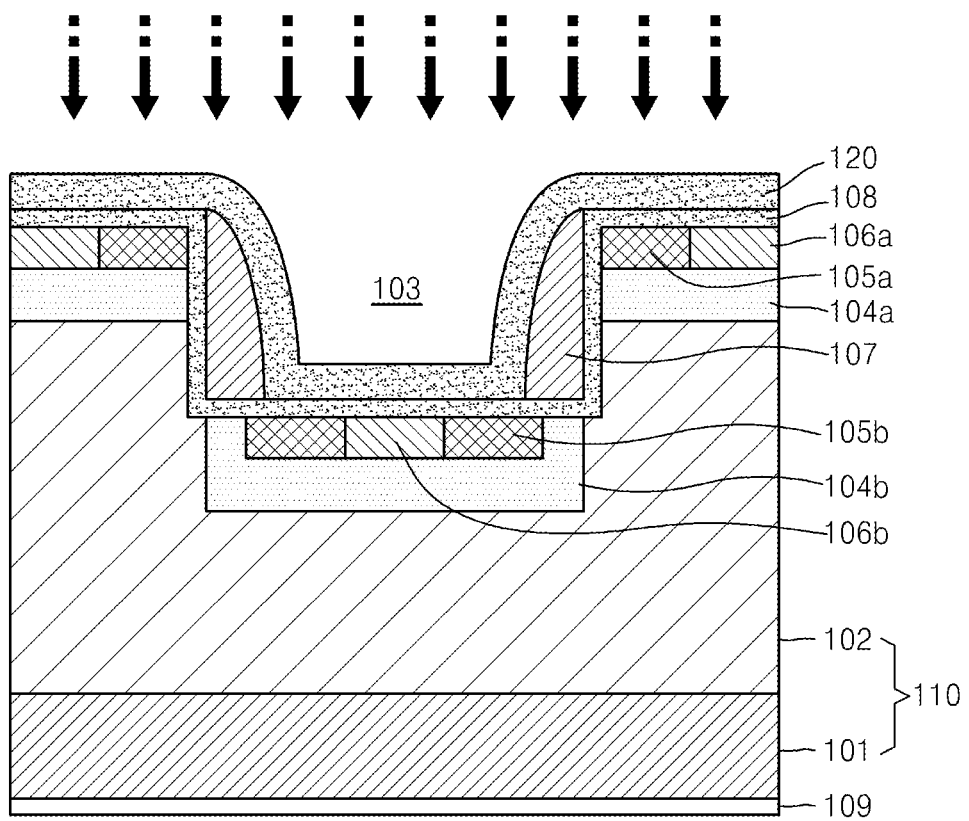
Figure 5I:
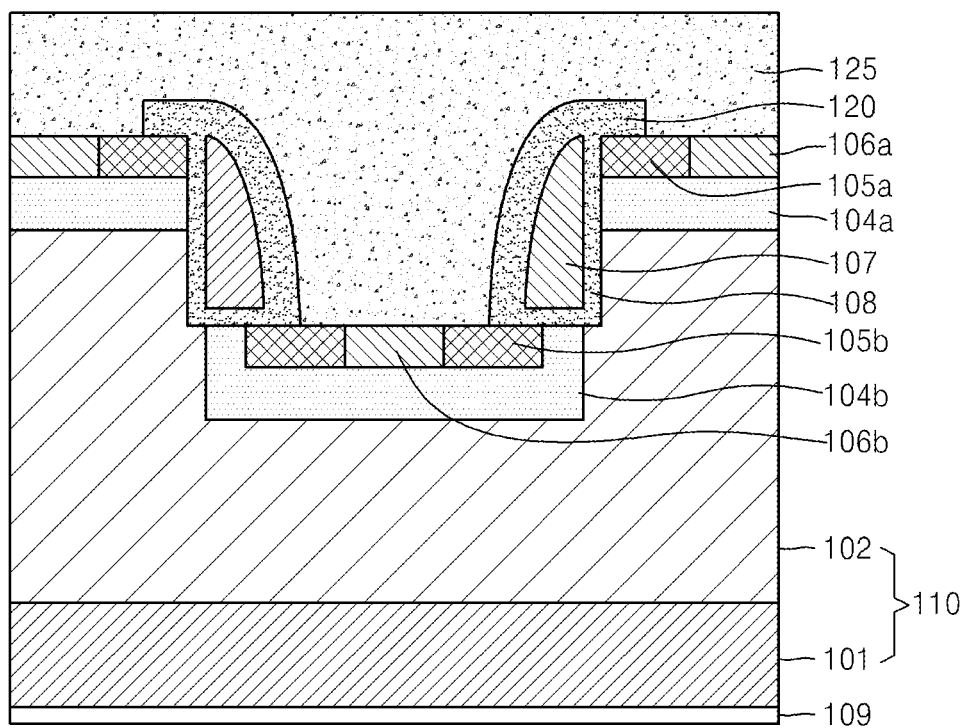

After forming the gate 107, as illustrated in FIG. 5H, the interlayer insulating layer 120 may be formed on the upper surface of the substrate 110 and the side walls and the bottom surface of the trench 103 to a uniform thickness to cover the gate 107 and the gate oxide layer 108. Here, the gate oxide layer 108 and the interlayer insulating layer 120 may be formed of the same material.

Finally, referring to FIG. 5I, the gate oxide layer 108 and the interlayer insulating layer 120 that cover the first and second source regions 105a and 105b are partially removed so that parts of the first and second source regions 105a and 105b are exposed. At this time, the entire first and second ohmic contact layers 106a and 106b may be completely exposed. Then, a conductive material such as a metal is deposited on the upper surface of the substrate 110 and in the trench 103 so that the source electrode 125 may be formed.

While a semiconductor device having a dual parallel channel structure according to the present disclosure and the method of fabricating the same have been particularly shown and described with reference to various example embodiments herein, it will be understood by those of ordinary skill in the art that various changes in form and details may be made without departing from the spirit and scope of the present disclosure as defined by the following claims.

What is claimed is:

1. A semiconductor device, comprising:
    a gate arranged along side walls of a trench;
    a gate oxide layer between the side walls of the trench and the gate and between a bottom surface of the trench and the gate;
    a first source region disposed to face an upper portion of the gate, the first source region being doped to a first conduction type;
    a second source region on the bottom surface of the trench, the second source region being of the first conduction type;
    a first well region on a lower surface of the first source region; and
    a second well region on a lower surface of the second source region, the first and second well regions doped to a second conduction type, the second conduction type being electrically opposite to the first conduction type.

2. The semiconductor device as claimed in claim 1, wherein the gate is circular, polygonal ring-shaped, or linear-shaped.

3. The semiconductor device as claimed in claim 1, wherein the gate oxide layer exposes a central portion of the bottom surface of the trench.

4. The semiconductor device as claimed in claim 1, wherein the second source region is partially present on the bottom surface of the trench, the second source region surrounding a central portion of the bottom surface of the trench, the gate overlaps an edge of the second source region, and the first source region faces an upper portion of a side surface of the gate.

5. The semiconductor device as claimed in claim 1, wherein the first and second source regions are N+-doped, and the first and second well regions are P-doped.

6. The semiconductor device as claimed in claim 1, wherein the first well region is below an entirety of the first source region, the second well region entirely surrounds a bottom surface and side walls of the second source region, and the gate overlaps a part of the second well region that surrounds the side walls of the second source region.

7. The semiconductor device of claim 1, further comprising: a substrate including a drift region, the drift region being doped to the first conduction type.

8. The semiconductor device of claim 7, wherein the first source region is on an upper surface of the substrate.

9. The semiconductor device of claim 7, wherein the first well region is between the first source region and the drift region.

10. The semiconductor device of claim 7, wherein the second well region is between the second source region and the drift region.

11. The semiconductor device as claimed in claim 7, further comprising:

a drain electrode on a lower surface of the substrate;

a source electrode on the substrate and in the trench so as to be electrically connected to the first and second source regions; and an interlayer insulating layer covering the gate and the gate oxide layer such that the gate and the gate oxide layer do not contact the source electrode.

12. The semiconductor device as claimed in claim 11, further comprising:

a first ohmic contact layer between the first well region and the source electrode so as to provide ohmic contact between the source electrode and the first source region; and a second ohmic contact layer in a central portion of the second source region so as to provide ohmic contact between the source electrode and the second source region, wherein the first and second ohmic contact layers are doped to the second conduction type.

13. The semiconductor device as claimed in claim 12, wherein the first ohmic contact layer is on the first well region so as to be adjacent to the first source region, and the second ohmic contact layer is on the second well region so as to be adjacent to the second source region.

14. The semiconductor device as claimed in claim 7, wherein the substrate includes a lower region, the drift region being on the lower region, the lower region and the drift region are doped to the first conduction type, a doping concentration of the drift region being lower than that of the lower region, and the lower region of the substrate is N+-doped and the drift region is N-doped.

* * * * *